(12) United States Patent
Davis

(10) Patent No.: US 7,206,798 B1
(45) Date of Patent: Apr. 17, 2007

(54) APPARATUS AND METHOD FOR PROGRAMMABLE DUAL STAGE DIGITAL FILTER

(75) Inventor: Barry Allen Davis, Union City, CA (US)

(73) Assignee: Adaptec, Inc., Milpitas, CA (US)

( * ) Notice: Subject to any disclaimer, the term of this patent is extended or adjusted under 35 U.S.C. 154(b) by 648 days.

(21) Appl. No.: 10/209,494

(22) Filed: Jul. 30, 2002

(51) Int. Cl.
*G06F 17/10* (2006.01)

(52) U.S. Cl. ..................................... 708/300
(58) Field of Classification Search ............... 708/200, 708/300–323
See application file for complete search history.

(56) References Cited

U.S. PATENT DOCUMENTS

| | | | | | |
|---|---|---|---|---|---|
| 4,314,347 A | * | 2/1982 | Stokely | ....................... | 702/17 |
| 4,587,620 A | * | 5/1986 | Niimi et al. | ................ | 708/300 |
| 4,750,156 A | * | 6/1988 | Abrams et al. | ............... | 367/42 |
| 5,034,744 A | * | 7/1991 | Obinata | ...................... | 341/118 |
| 5,119,321 A | * | 6/1992 | Burton et al. | ............... | 708/300 |
| 5,550,840 A | * | 8/1996 | O'Brien | ...................... | 714/724 |
| 5,561,687 A | * | 10/1996 | Turner | ......................... | 708/319 |
| 5,732,003 A | * | 3/1998 | White et al. | ................ | 708/300 |
| 5,734,663 A | * | 3/1998 | Eggenberger | ............... | 714/762 |
| 6,590,932 B1 | * | 7/2003 | Hui et al. | .................... | 708/322 |
| 6,608,862 B1 | * | 8/2003 | Zangi et al. | ................ | 708/323 |
| 6,823,017 B1 | * | 11/2004 | Davis et al. | ................ | 708/300 |

* cited by examiner

*Primary Examiner*—Meng-Ai T. An
*Assistant Examiner*—Chat C. Do
(74) *Attorney, Agent, or Firm*—Martine Penilla & Gencarella, LLP

(57) ABSTRACT

The present invention provides a dual stage digital filter and a method for filtering digital data signals. The dual stage digital filter includes a pre-filter, a main filter, and an output register. The pre-filter receives a set of first data bits as inputs and is arranged to filter single noise bits from the set of input data bits to output a set of second data bits. The main filter is coupled to receive the set of second data bits as inputs and is arranged to filter burst noise bits from the set of second data bits to output a set of third data bits. The output register is coupled to receive and store the set of third data bits for output.

34 Claims, 5 Drawing Sheets

APPARATUS AND METHOD FOR PROGRAMMABLE DUAL STAGE DIGITAL FILTER

BACKGROUND OF THE INVENTION

1. Field of the Invention

This invention relates generally to data communications and more particularly to digital filters for removing noise from input data bits.

2. Description of the Related Art

Modern data communication devices generally utilize filters to filter out unwanted signals such as noise, false transitions, etc. For example, conventional filters such as LC circuits have been widely used to filter signals. However, LC circuits are typically very complex and expensive to implement in integrated circuit (IC) chips due to the inductors in the LC circuits.

An improved filter using only digital circuits is described, for example, in U.S. Pat. No. 5,789,969 entitled "Digital Delay Circuit and Method" by Barry Davis et al. In this patent, a digital blanking filter is used to compensate for delay variations caused by variations in process, temperature, and voltage. However, the digital blanking filter may sense the first signal transitions falsely because noise may be additive. At high frequencies and long transmission paths, the filter may not be able to filter signals effectively.

Some filters also may use oversampling techniques to sample a signal at a higher frequency. However, oversampling often injects noise such as single bit noise or burst noise in the process. In such cases, conventional digital filters may not be able to remove the noise efficiently.

In view of the foregoing, it would be desirable to have a digital filter that can efficiently filter both single bit noise and burst noise and that can be implemented in an IC chip in a cost effective manner.

SUMMARY OF THE INVENTION

The present invention fills these needs by providing a programmable dual stage digital filter and a method therefor. It should be appreciated that the present invention can be implemented in numerous ways, including as a process, an apparatus, a system, a device, a method, or a computer readable medium. Several inventive embodiments of the present invention are described below.

In one embodiment, the present invention provides a dual stage digital filter that includes a pre-filter, a main filter, and an output register. The pre-filter receives a set of first data bits as inputs and is arranged to filter single noise bits from the set of input data bits to output a set of second data bits. The main filter is coupled to receive the set of second data bits as inputs and is arranged to filter burst noise bits from the set of second data bits to output a set of third data bits. The output register is coupled to receive and store the set of third data bits for output.

In another embodiment, a dual stage digital filter includes first filtering means, second filtering means, and storage means. The first filtering means receives a set of first data bits as inputs for filtering single noise bits from the set of input data bits to output a set of second data bits. The second filtering means receives the set of second data bits as inputs for filtering burst noise bits from the set of second data bits to output a set of third data bits. The storage means receives the third data bits and stores the set of third data bits for output.

In yet another embodiment, a method for filtering digital data signals is disclosed. The method includes: (a) receiving a set of first data bits as inputs; (b) filtering single noise bits from the set of input data bits to output a set of second data bits; (c) filtering burst noise bits from the set of second data bits to output a set of third data bits; and (d) outputting the set of third data bits.

Preferably, the number of second data bits in each set is programmable to allow application in a wide range of data communication devices. The dual stage digital filters of the present invention thus removes both single bit noise and burst noise from input data bits in stages. The pre-filter is adapted to remove single noise bits from the input data while the main filter is adapted to remove burst noise bits. By separately removing single bit noise and burst noise, the dual stage filters can be implemented in an IC chip at a low cost with minimal complexity in circuitry. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

The present invention provides a programmable dual stage digital filter and a method therefor. It will be obvious, however, to one skilled in the art, that the present invention may be practiced without some or all of these specific details. In other instances, well known process operations have not been described in detail in order not to unnecessarily obscure the present invention.

Figure 1:
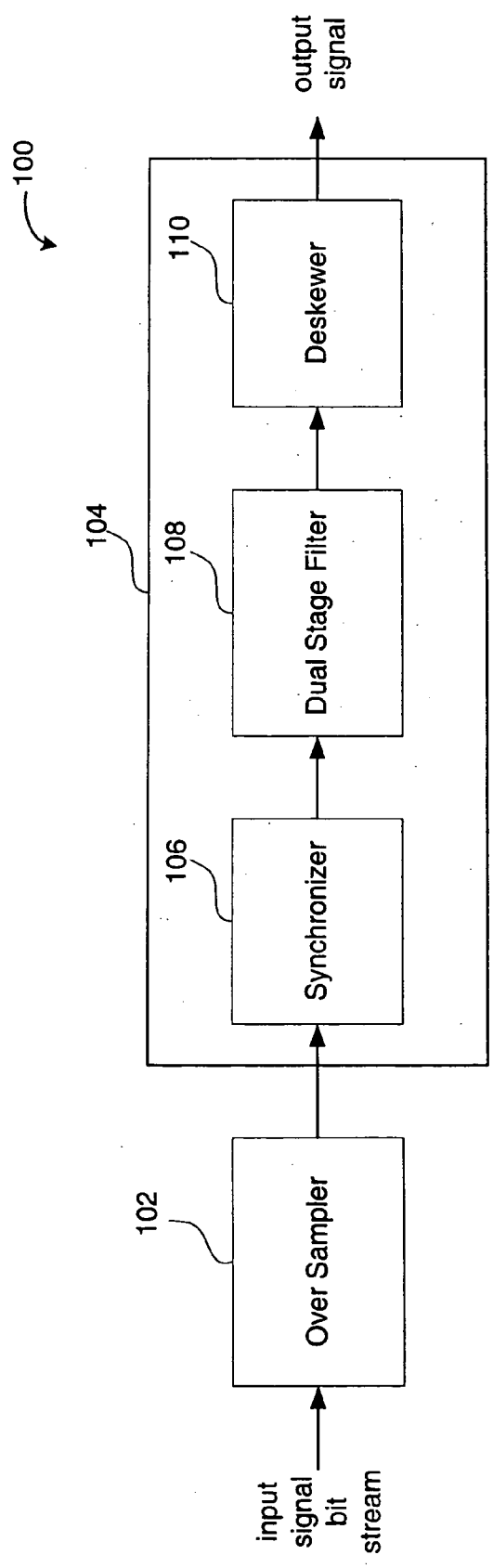
FIG. 1 shows an overview block diagram of a circuit for filtering input signal bit stream in accordance with one embodiment of the present invention.

FIG. 1 shows an overview block diagram of a circuit 100 for filtering input signal bit stream in accordance with one embodiment of the present invention. The circuit includes an oversampler 102 and a digital signal processor (DSP) 104. The oversampler 102 receives the input signals that are adapted to operate at a specified frequency and samples the input signals at a higher clock frequency to generate sets of N parallel bit samples staggered in time, where N can be any suitable integer number greater than 1. For example, the oversampler 102 may sample an input signal adapted to operate at 80 Mhz at 3.2 Ghz to generate groups of 8 parallel bit (i.e., a byte) sample data with each bit sample being staggered in time. It should be noted that the circuit 100 processes a signal on a single line such as a single SCSI line. As such, when used in conjunction with SCSI buses, the circuit 100 may be provided for each SCSI line such as data, ACK, REQ, P1 (parity 1), and P0 (parity 0).

The DSP 104 includes a synchronizer 106, a dual stage filter 108, and a deskewer 110 for processing the N parallel bit data samples. The synchronizer 106 is coupled to receive the N bit sample data from and synchronizes the data samples to an external clock that operates, for example, at 400 Mhz. The synchronizer 106 may be implemented using a four byte rollover FIFO where incoming data are written into successive stages of the FIFO. The synchronizer 104 outputs a 14-bit word by using a shift register for input to the dual stage filter 108. The 14-bit output word from the synchronizer 104 includes eight bits of current sample byte and the last six bits of the previous sample byte.

Preferably, the synchronizer FIFO 106 described above operates at the essentially the same frequency as the parallel samples are generated, in the above example at 400 Mhz. The FIFO compensates for any clock delays between the 8 bit parallel samples and filters. Generally, the FIFO neither replicates nor skips any 8 bit parallel samples in the sample data stream.

The dual stage filter 108 is coupled to receive the 14-bit word from the synchronizer 106 and filters one bit noise and burst noise to output an 8-bit output data. The deskewer 110 is coupled to the dual stage filter 108 to receive the filtered 8-bit data from the dual stage filter 108 and deskews any signal discrepancies of the DSP 104 with other DSPs. It then outputs the deskewed and filtered 8-bit data, which may undergo bit alignment to align the output data with data in other DSPs.

Figure 2:
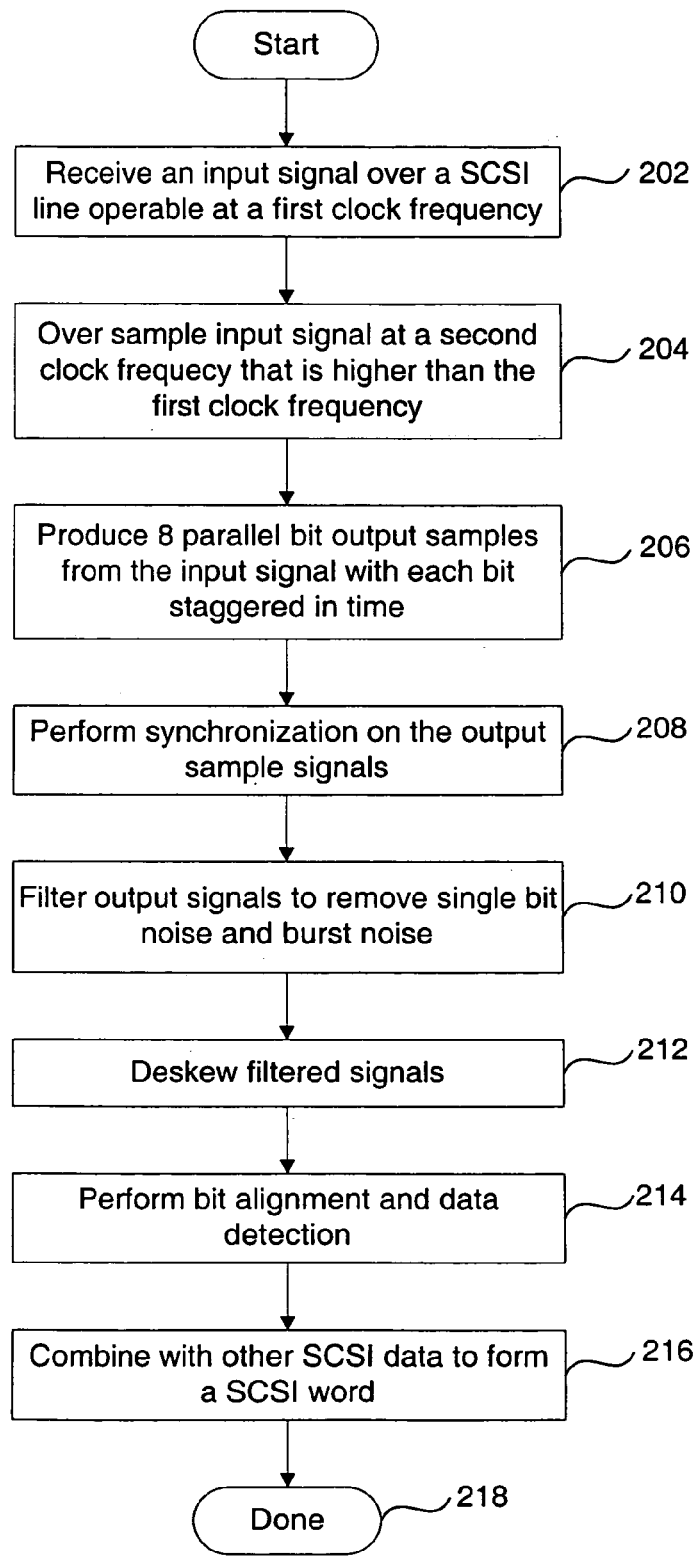
FIG. 2 shows a flowchart of an exemplary method for filtering an input data bit stream in accordance with one embodiment of the present invention.

FIG. 2 shows a flowchart of an exemplary method 200 for filtering an input data bit stream in accordance with one embodiment of the present invention. In this embodiment, the method 200 illustrates filtering of a single bit of data on a single SCSI bus line. However, those skilled in the art will appreciate that the method is equally applicable to other data or control lines that require filtering.

Initially, an input bit signal is received in operation 202 over a SCSI line that is adapted to operate at 80 Mhz. Then, the input signal is over sampled in operation 204 at a clock frequency (e.g., 3.2 Ghz) that ensures generation of N parallel bit samples, preferably eight parallel bit sample, in operation 206. Each of the N parallel bit samples is staggered in time. Then in operation 208, N parallel bit samples are synchronized and output along with the last M bits from the previous bit samples to form N+M output bits. For example, 8 parallel bit samples and the last 6 bits from previous bit samples may be output as a 14-bit word.

The N+M output bits are then filtered to remove a single bit noise and burst noise in operation 210 to output an N-bit filtered word. The N-bit word is then deskewed in operation 212. The N bits are then aligned and data detection performed to generate a single SCSI bit signal in operation 214. Finally, the single SCSI bit is then combined with other SCSI data to form a SCSI word in operation 216. The method then terminates in operation 218.

Figure 3:
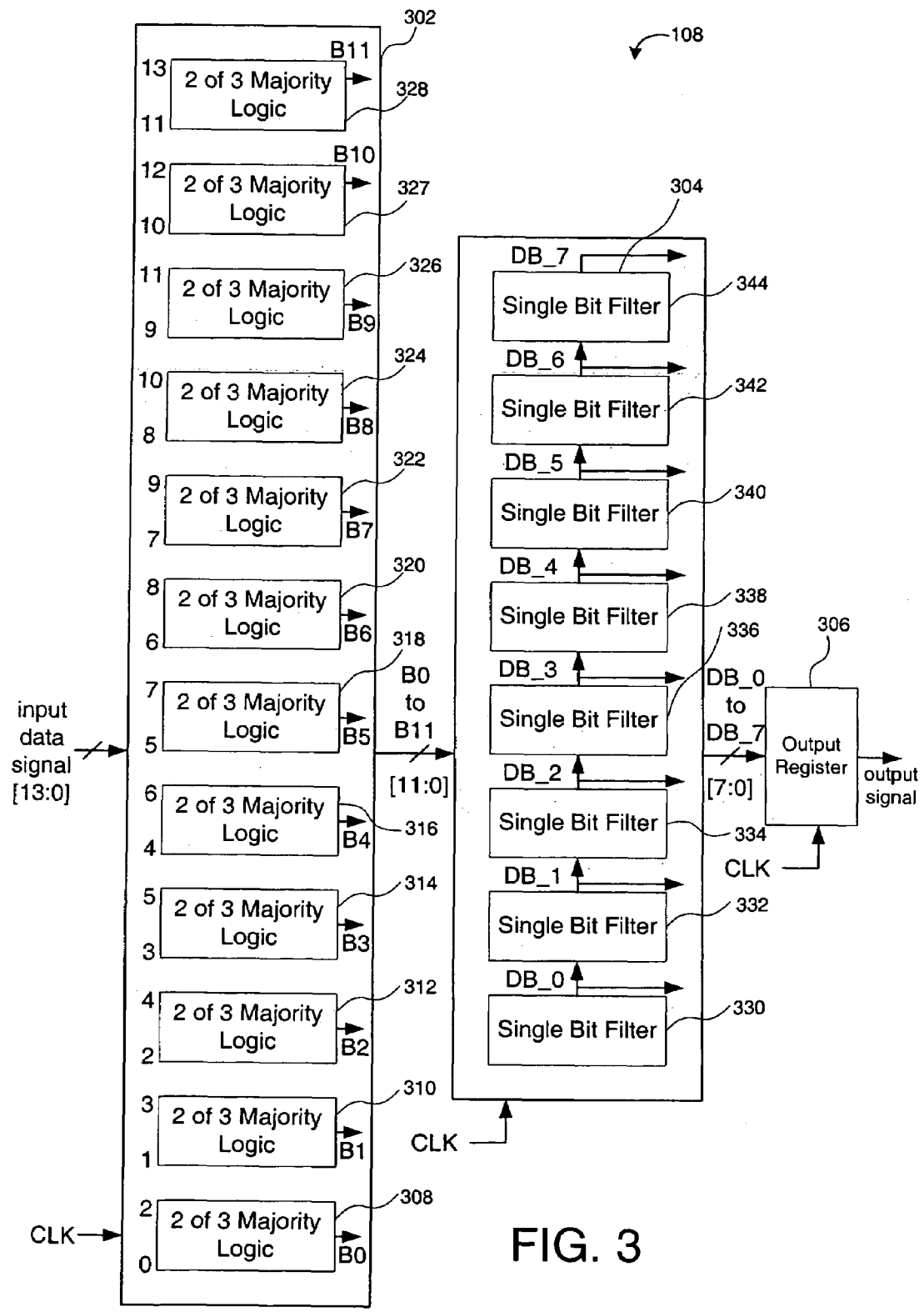
FIG. 3 shows a more detailed schematic diagram of a dual stage filter that includes a pre-filter and a main filter in accordance with one embodiment of the present invention.

FIG. 3 shows a more detailed schematic diagram of the dual stage filter 108 in accordance with one embodiment of the present invention. The dual stage filter 108 includes a pre-filter 302, a main filter 304, and an output register 306, each of which receives a clock signal CLK operating at, for example, 400 Mhz. The pre-filter 302 includes twelve two-of-three majority logic 308 to 328 for receiving and processing the fourteen input data bit signals [13:0]. Each of the two-of-three majority logic 308 to 318 receives three input data bits and outputs a single data bit Bi. In this configuration, each of the two-of-three majority logic 308 to 328 receives three input data bits in a staggered fashion and determines whether the majority of the three input data bits is a "1" or a "0" to output a single data bit Bi that is either a "1" or a "0." That is, each two-of-three majority logic determines whether the three input bits contain more 1s or more 0s. If the majority of the three bits is "1," the two-of-three majority logic outputs a value of "1" for Bi. Conversely, if the majority of the three input bits is "0," the two-of-three majority logic outputs a value of "0" for Bi.

To process the fourteen input data bits, the two-of-three majority logic 308 to 328 are adapted to receive the fourteen input data bits [13:0] in a staggered fashion, preferably staggered by one bit. For example, the first two-of-three majority logic 308 receives the first three input data bits [2:0] and generates an output bit B0. Likewise, the second two-of-three majority logic 310 receives three input data bits [3:1] and generates an output bit B1. Similarly, the third two-of-three majority logic 312 receives three input data bits [4:2] and generates an output bit B2, and so on for the other two-of-three majority logic 314 to 328. For example, the last majority logic 328 receives the input data bits [13:11] to generate output bit B11. By processing the input data bits in this staggered manner, the pre-filter 302 generates twelve output bits [11:0], i.e., B0 to B11, removes single bit noise from the input data bits. It should be noted that the pre-filter 302 may be implemented using any K of L majority logic where L is an odd integer and K is an even integer equal to $L/2+\frac{1}{2}$. In addition, the pre-filter 302 may receive any suitable number of input bits and include any number of majority logic units to generate output bits equal to the number of majority logic units.

The twelve output bits B0 to B11 are then provided as inputs to the main filter 304, which is adapted to remove burst noise to generate eight decision bits [7:0], i.e., decision byte DB0 to DB7. For generating the decision bits DB0 to DB7, the main filter 304 includes single bit filters 330, 332, 334, 336, 338, 340, 342, and 344 each of which is arranged to receive a set of data bits from the pre-filter 302 in a staggered fashion, preferably staggered by one bit. The number of data bits (J data bits) that each single bit filter receives and processes is programmable and represents the span of the main filter 304. Preferably, all single bit filters 330 to 344 receive the same J number of data bits such as 3, 4, 5, 6, 7, etc.

For example, the first single bit filter 330 receives five input bits B0 to B4 to generate decision bit DB_0. Likewise, the second single bit filter 332 receives five input bits staggered by one bit, i.e., input bits B1 to B5 to produce decision bit DB_1. Similarly, the third single bit filter 334 receives and processes five input bits B2 to B6 to generate decision bit DB_2, and so on for the other single bit filters 336 to 344. For the last single bit filter 344, for example, five input bits B7 to B11 are provided to generate decision bit DB_7.

The main filter 304 is also configured to look back in time to the last valid decision bit. For example, if a single bit filter is not able to determine whether a bit is a "1" or a "0," it will use a previous decision bit that has been set validly. To implement this feature, in addition to outputting decision bits, each of the single bit filters 330 to 344 is coupled to provide its output decision bit to the next single bit filter. For example, single bit filter 330 provides its decision bit DB_0 to the next single bit filter 332, which in turn provides its decision bit DB_1 to the next single bit filter 334. When the single bit filter 332 cannot determine whether the input bits DB_1 to DB_5 are all 1s or all 0s, it will output the previous decision bit DB_0 as DB_1.

As will be described in more detail below, the single bit filters 330 to 344 in the main filter 304 effectively removes burst noise. It should be noted that the main filter 304 may be implemented using any number of single bit filters to generate decision bits equal to the number of the single bit filters. The main filter 304 thus generates decision bits DB_0 to DB_7, i.e., decision byte, which are provided to the output register 306. The output register 306 stores the decision bits DB_0 to DB7 for output. Preferably, the output register 306 is a shift register than shifts the decision byte as the next decision byte is received.

Figure 4:
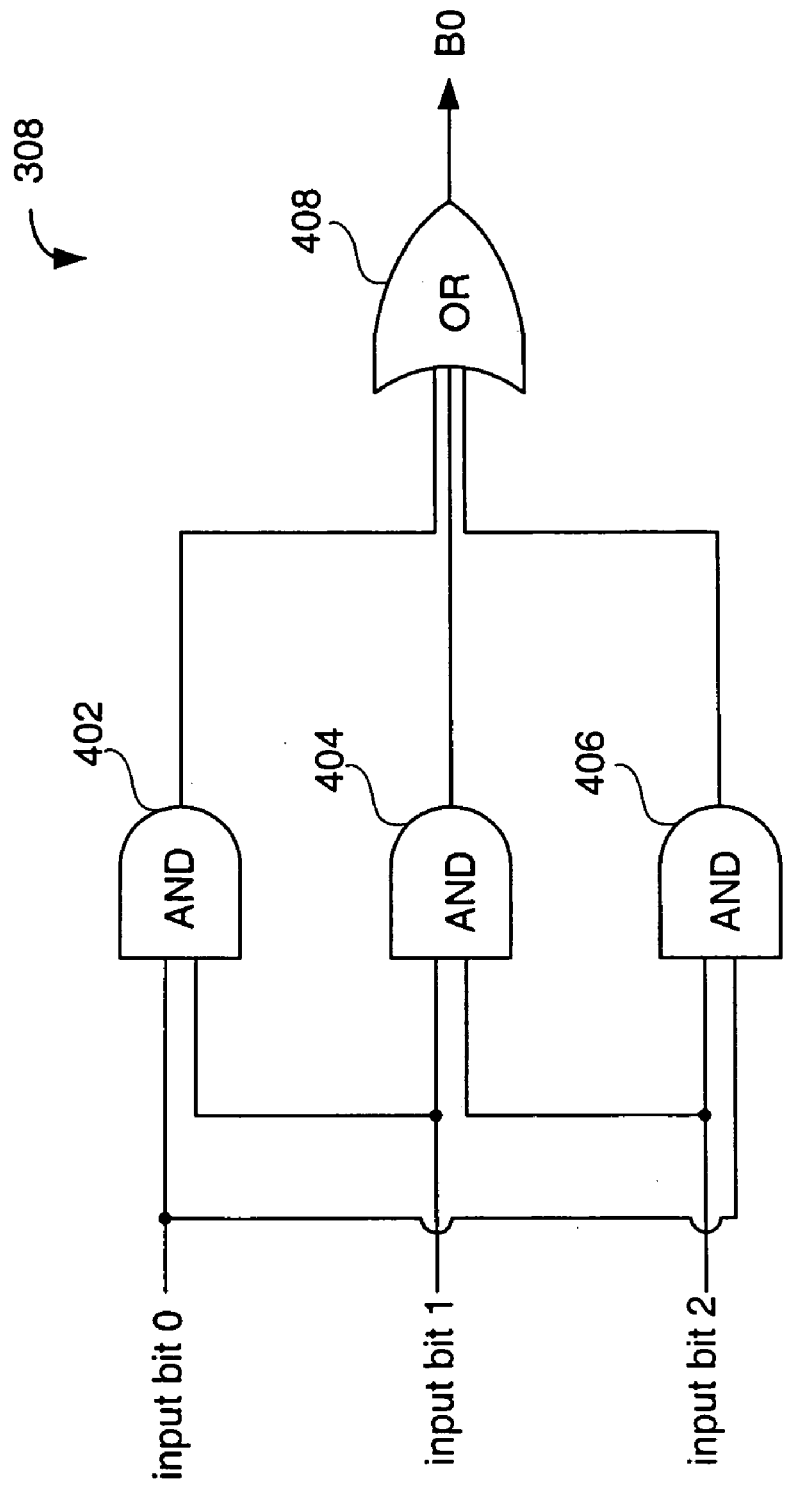
FIG. 4 illustrates a more detailed circuit diagram of an exemplary two-of-three logic in the pre-filter in accordance with one embodiment of the present invention.

FIG. 4 illustrates a more detailed circuit diagram of the two-of-three logic 308 in the pre-filter 302 in accordance with one embodiment of the present invention. It should be noted that other majority logic 310 to 328 in the pre-filter may be implemented in a similar manner. In addition, those skilled in the art will recognize that a generic K of L majority logic may be easily be constructed in a similar fashion. The two-of-three majority logic 308 includes AND gates 402, 404, and 406, and an OR gate 408. The AND gate 402 receives input data bits 0 and 1 to generate an output. Similarly, the AND gate 404 is arranged to receive input data bits 1 and 2 to generate an output while the AND gate 406 receives input data bits 0 and 2 to generate an output. The outputs from the AND gates 402, 404, and 406 are fed into the OR gate 408, which produces output data bit B0.

In this configuration, the two-of-three logic 308 receives the three input data bits and outputs a single data bit Bi that is either a "1" or a "0." For example, if two or more of the three input bits are 1, then the OR gate outputs a "1" as B0. On the other hand, if two or more of the three input bits are 0, then the OR gate outputs a "0" as B0. In this manner, the two-of-three majority logic 308 removes single bit noise from the input data bits.

Figure 5:
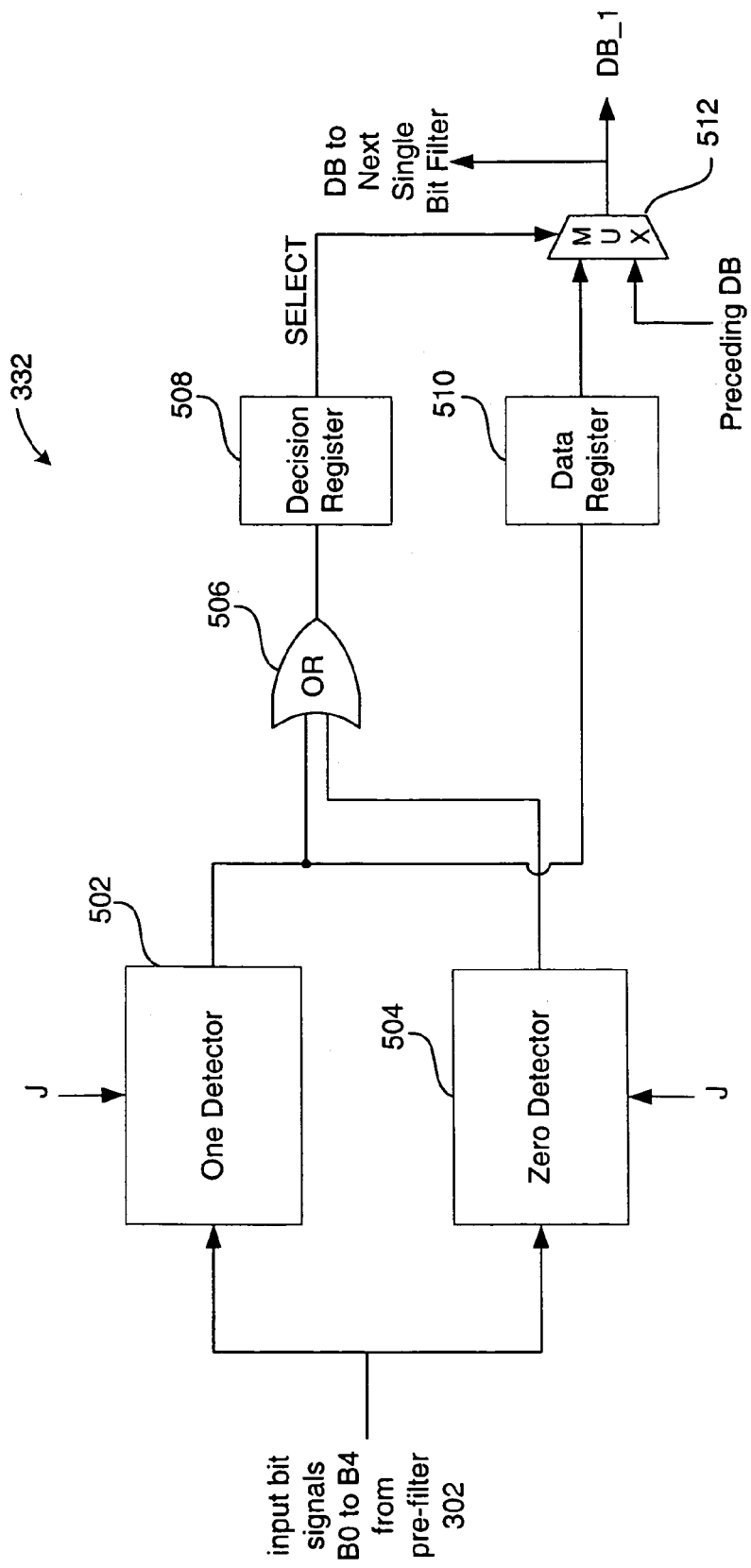
FIG. 5 shows a schematic diagram of an exemplary single bit filter in the main filter in accordance with one embodiment of the present invention.

FIG. 5 shows a schematic diagram of the single bit filter 332 in the main filter 304 in accordance with one embodiment of the present invention. Other single bit filters 330 and 334 to 344 in the main filter 304 may also be implemented in a similar manner. The single bit filter 332 includes a one detector 502, a zero detector 504, an OR gate, a decision register 508, a data register 510, and a multiplexer 512. The one detector 502 and zero detector 504 receives a span signal J that indicates the span or the number of signals to be processed. As indicated above, the span J is programmable or can be set to a predetermined value. In the illustrated embodiment, the span J is five; however, other numbers may also be used without varying from the scope of the present invention.

Matching the span J, the one detector 502 and zero detector 504 also receives five input data bits B0 to B4 from the pre-filter 302 for determining whether all input data bits B5 are "1" or a "0." In this arrangement, the one detector 502 and zero detector 504 are mutually exclusive in that the outputs of both detectors 502 and 504 cannot be both "1." Specifically, the one detector 502 receives the input data bits and determines if all bits are "1." If so, it will output a value of "1." Otherwise, it outputs a value of "0." Similarly, the zero detector 504 receives the input data bits and determines if all bits are "0." If so, it outputs a value of "1." Otherwise, it will output a value of "0."

The outputs of the detectors 502 and 504 are provided to the OR gate 506, which performs an OR operation and outputs a result to the decision register 508. The decision register 508 is arranged to store and output the result to the multiplexer 512 as a control signal SELECT. The data register 510 is coupled to receive and store the output from the one detector 502 as a decision bit.

The multiplexer 512 is coupled to receive the control signal SELECT, the decision bit from the data register 510, and a preceding decision bit (e.g., DB_0). If the value of SELECT is "1," it means that a valid "1" or "0" has been detected. In this case, the multiplexer 512 selects the decision bit from the data register 510 for output as decision bit DB_1.

On the other hand, if the value of the signal SELECT is "0," it means that a valid "1" or "0" has not been detected. In this case, the multiplexer 512 selects the preceding decision bit DB_0 for output as decision bit DB_1. In either case, the decision bit DB_1 is then provided to the next single bit filter 334 as a preceding decision bit DB_1. In so doing, the single bit filter 332 removes burst noise from the input data bits.

The dual stage digital filters of the present invention thus removes both single bit noise and burst noise from input data bits in stages. The pre-filter is adapted to remove single noise bits from the input data while the main filter is adapted to remove burst noise bits. By separately removing single bit noise and burst noise, the dual stage filters can be implemented in an IC chip at a low cost with minimal complexity in circuitry. In addition, the programmability of the dual stage filter allows application in wide range of data communication devices.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A dual stage digital filter, comprising:
   a digital pre-filter receiving a set of first data bits as inputs and being arranged to filter single noise bits from the set of input data bits to output a set of second data bits, wherein the pre-filter includes a set of majority logic circuits, each majority logic circuit being arranged to receive a subset of the first data bits as inputs for generating one of the second data bits;
   a main filter coupled to receive the set of second data bits as inputs and being arranged to filter burst noise bits from the set of second data bits to output a set of third data bits; and
   an output register coupled to receive and store the set of third data bits for output.

2. The dual stage digital filter as recited in claim 1, wherein the output register is a shift register.

3. A dual stage digital filter, comprising:
   a pre-filter receiving a set of first data bits as inputs and being arranged to filter single noise bits from the set of input data bits to output a set of second data bits, wherein the pre-filter includes a set of majority logic circuits, each majority logic circuit being arranged to receive a subset of the first data bits as inputs for generating one of the second data bits, wherein each majority logic circuit is configured to output the second data bit that represents the majority value of the subset of the first data bits such that a single noise bit is removed from the subset of the first data bits;

a main filter coupled to receive the set of second data bits as inputs and being arranged to filter burst noise bits from the set of second data bits to output a set of third data bits; and an output register coupled to receive and store the set of third data bits for output.

4. The dual stage digital filter as recited in claim 3, wherein the majority logic circuits are K of L majority logic circuits where L is an odd integer and K is an even integer equal to L/2+½.

5. The dual stage digital filter as recited in claim 4, wherein the K of L majority logic circuits are two-of-three majority logic circuits.

6. The dual stage digital filter as recited in claim 3, wherein the subsets of the first data bits input to the majority logic circuits are staggered by one bit.

7. The dual stage digital filter as recited in claim 3, wherein each majority logic circuit includes a set of AND gates and an OR gate.

8. The dual stage digital filter as recited in claim 3, wherein the main filter includes a set of single bit filters, each of which is arranged to receive a subset of the second data bits as inputs for generating one of the third data bits, wherein each single bit filter is configured to remove burst noise to output the one of the third data bits.

9. The dual stage digital filter as recited in claim 8, wherein the single bit filters are arranged in sequence from a first stage single bit filter to a last stage single bit filter, wherein one stage single bit filter provides its output third data bit to the next stage single bit filter as a decision bit, wherein the next stage single bit filter outputs the decision bit received from the previous stage single bit filter as its third data bit when the next stage single bit filter is not able to determine whether the input second data bits are all one or zero.

10. The dual stage digital filter as recited in claim 8, wherein the subsets of the second data bits input to the single bit filters are staggered by one bit.

11. The dual stage digital filter as recited in claim 8, wherein each single bit filter is arranged to receive a span signal that indicates the number of data bits in each subset of second data bits.

12. The dual stage digital filter as recited in claim 11, wherein the span of the span signal is programmable.

13. The dual stage digital filter as recited in claim 12, wherein the span is five.

14. The dual stage digital filter as recited in claim 3, wherein the output register is a shift register.

15. A method for filtering digital data signals, comprising:
receiving a set of first data bits as inputs;
filtering single noise bits from the set of input data bits to output a set of second data bits;
receiving subsets of the second data bits as inputs for generating the third data bits;
filtering each subset of the set of second data bits to remove burst noise bits from the set of second data bits to output a set of third data bits; and
outputting the set of third data bits.

16. The method as recited in claim 15, wherein the operation of filtering the single noise bits further comprises:
receiving subsets of the first data bits as inputs for generating the second data bits; and
filtering each subset of the first data bits to output one of the second data bit that represents the majority value of the each subset of the first data bits such that a single noise bit is removed from the each subset of the first data bits.

17. The method as recited in claim 16, the subsets of the first data bits are staggered by one bit.

18. The method as recited in claim 15, wherein the subsets of the second data bits are staggered by one bit.

19. The method as recited in claim 18, wherein the subsets of the second data are provided to a set of single bit filters that are arranged in sequence from a first stage single bit filter to a last stage single bit filter, each single bit filter receiving one subset of the second data, wherein the third data bit generated from one single bit filter is provided to the next stage single bit filter as a decision bit, wherein the next stage single bit filter outputs the decision bit received from the previous stage single bit filter as its third data bit when the next stage single bit filter is not able to determine whether its input second data bits are all one or a zero.

20. The method as recited in claim 19, wherein each single bit filter is arranged to receive a span signal that indicates the number of data bits in each subset of second data bits.

21. The method as recited in claim 20, wherein the span of the span signal is programmable.

22. The method as recited in claim 21, wherein the span is five.

23. A dual stage digital filter, comprising:
a pre-filter receiving a set of first data bits as inputs and being arranged to filter single noise bits from the set of input data bits to output a set of second data bits;
a main filter coupled to receive the set of second data bits as inputs and being arranged to filter burst noise bits from the set of second data bits to output a set of third data bits, wherein the main filter includes a set of single bit filters, each of which is arranged to receive a subset of the second data bits as inputs for generating one of the third data bits, wherein each single bit filter is configured to remove burst noise to output the one of the third data bits; and
an output register coupled to receive and store the set of third data bits for output.

24. The dual stage digital filter as recited in claim 23, wherein the single bit filters are arranged in sequence from a first stage single bit filter to a last stage single bit filter, wherein one stage single bit filter provides its output third data bit to the next stage single bit filter as a decision bit, wherein the next stage single bit filter outputs the decision bit received from the previous stage single bit filter as its third data bit when the next stage single bit filter is not able to determine whether the input second data bits are all one or zero.

25. The dual stage digital filter as recited in claim 23, wherein the subsets of the second data bits input to the single bit filters are staggered by one bit.

26. The dual stage digital filter as recited in claim 23, wherein each single bit filter is arranged to receive a span signal that indicates the number of data bits in each subset of second data bits.

27. The dual stage digital filter as recited in claim 26, wherein the span of the span signal is programmable.

28. The dual stage digital filter as recited in claim 27, wherein the span is five.

29. The dual stage digital filter as recited in claim 23, wherein the pre-filter includes a set of majority logic circuits, each majority logic circuit being arranged to receive a subset of the first data bits as inputs for generating one of the second data bits, wherein each majority logic circuit is configured to output the second data bit that represents the majority value of the subset of the first data bits such that a single noise bit is removed from the subset of the first data bits.

30. The dual stage digital filter as recited in claim 29, wherein the majority logic circuits are K of L majority logic circuits where L is an odd integer and K is an even integer equal to L/2+½.

31. The dual stage digital filter as recited in claim 30, wherein the K of L majority logic circuits are two-of-three majority logic circuits.

32. The dual stage digital filter as recited in claim 29, wherein the subsets of the first data bits input to the majority logic circuits are staggered by one bit.

33. The dual stage digital filter as recited in claim 29, wherein each majority logic circuit includes a set of AND gates and an OR gate.

34. The dual stage digital filter as recited in claim 23, wherein the output register is a shift register.

* * * * *